US006930345B2

(12) United States Patent
Short

(10) Patent No.: US 6,930,345 B2
(45) Date of Patent: Aug. 16, 2005

(54) INCREASE IN DEEP TRENCH CAPACITANCE BY A CENTRAL GROUND ELECTRODE

(75) Inventor: Alvin P. Short, Chester, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 09/852,899

(22) Filed: May 10, 2001

(65) Prior Publication Data

US 2002/0167045 A1 Nov. 14, 2002

(51) Int. Cl.[7] .............................................. H01L 27/108
(52) U.S. Cl. ...................................................... 257/303
(58) Field of Search ................................. 257/301, 303, 257/304, 306; 438/243–246, 386–389

(56) References Cited

U.S. PATENT DOCUMENTS

| 5,291,438 | A | * | 3/1994 | Witek et al. ................. 365/149 |
| 5,677,225 | A | * | 10/1997 | Park ............................. 438/386 |
| 5,985,729 | A | * | 11/1999 | Wu ............................... 438/389 |
| 6,077,739 | A | * | 6/2000 | Chang .......................... 438/386 |
| 6,177,696 | B1 | * | 1/2001 | Bronner ....................... 257/301 |
| 6,251,722 | B1 | * | 6/2001 | Wei et al. .................... 438/243 |
| 6,297,121 | B1 | * | 10/2001 | Tseng .......................... 438/393 |
| 6,674,113 | B2 | * | 1/2004 | Goldbach et al. ........... 257/301 |

OTHER PUBLICATIONS

T. Hamamoto et al., Trench–Trench Leakage Current Characteristics in the Stacked Trench Capacitor (STT) Cell. IEEE 1991, pp. 419–422.*

* cited by examiner

*Primary Examiner*—Anh Duy Mai
(74) *Attorney, Agent, or Firm*—Brinks Hofer Gilson & Lione

(57) ABSTRACT

A semiconductor device includes a trench formed in a substrate, and a diffusion region surrounding the trench to form a buried plate. A first conductive material is formed in the trench and connects to the buried plate through a bottom of the trench to form a first electrode. A second conductive material is disposed in the trench to form a second electrode. A node dielectric layer is formed between the first electrode and the second electrode.

12 Claims, 9 Drawing Sheets

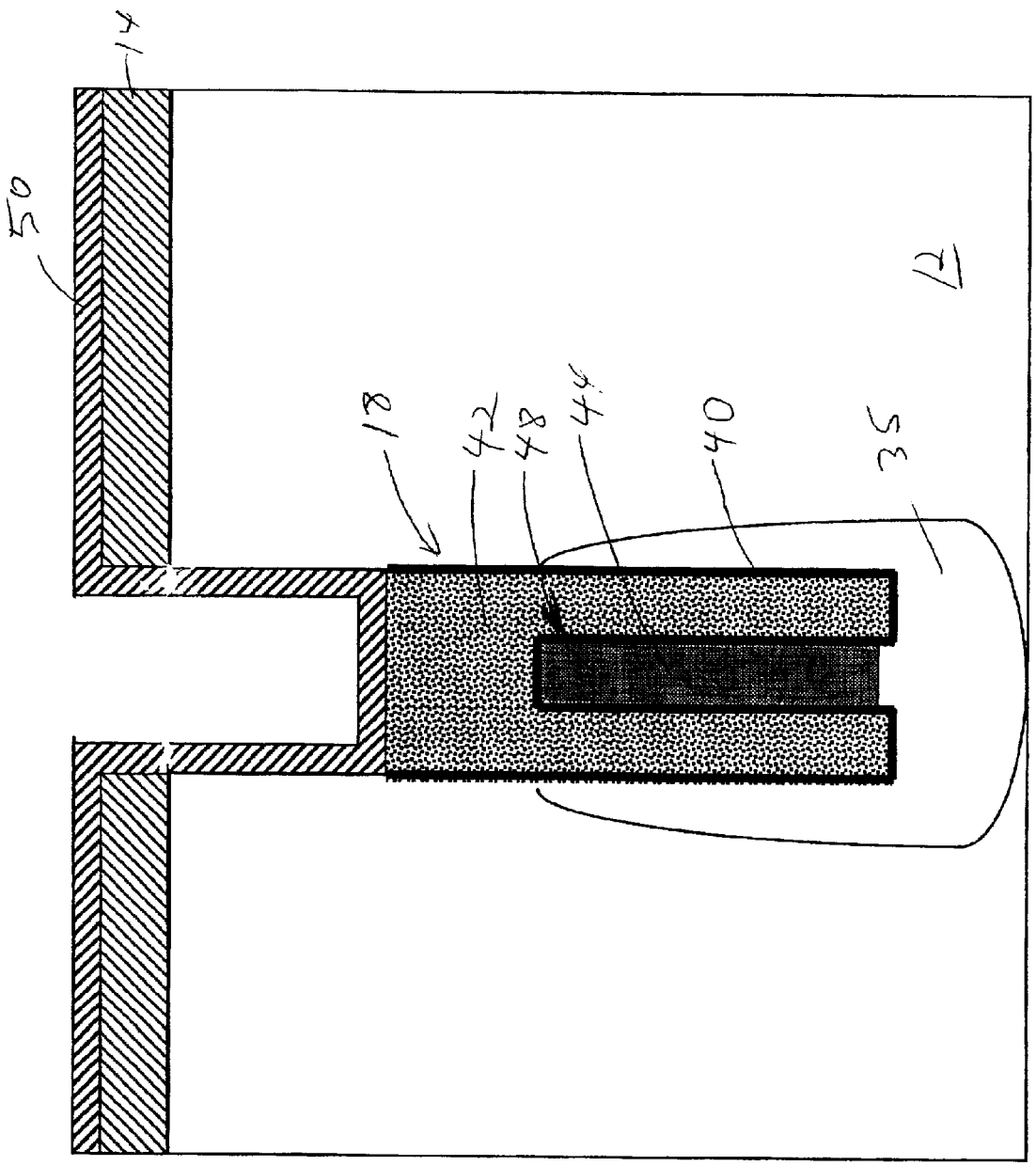

INCREASE IN DEEP TRENCH CAPACITANCE BY A CENTRAL GROUND ELECTRODE

BACKGROUND

1. Technical Field

This disclosure relates to semiconductor fabrication, and more particularly, to a structure and method to significantly increase the capacitance by forming a central ground electrode in a deep trench.

2. Description of the Related Art

Trench capacitor cells in dynamic random access memories (DRAMs) are commonly formed in a substrate. Trench capacitor cells include a trench having a storage node formed therein. The storage node acts as a first electrode to the trench capacitor. A buried plate is formed externally to the trench to form an outer plate of the trench capacitor, that is, the second electrode of the capacitor. The buried plate is formed by doping the silicon surrounding the etched trench which is then coated with a node dielectric and filled with a conductive material serving as the storage node or inner plate of the capacitor. The inner plate (or storage node) stores the signal charge and is connected to the drain of a transfer transistor switched by a wordline.

As smaller feature sizes are needed for future generations of trench capacitors, the conventional trench capacitors are pushed to the limits of their capabilities in terms of performance. One primary problem with dynamic random access (DRAM) designs using deep trench capacitor storage cells is maintaining a high capacity with decreasing feature size and keeping the charge in the deep trench from leaking out of the storage node. The conventional trench capacitors begin to lose capacitive area with smaller feature sizes and are susceptible to current leakage.

Therefore, a need exists for an improved trench capacitor for increasing capacitance and reducing current leakage therefrom.

SUMMARY OF THE INVENTION

A semiconductor device includes a trench formed in a substrate, and a diffusion region surrounding the trench to form a buried plate. A first conductive material is formed in the trench and connects to the buried plate through a bottom of the trench to form a first electrode. A second conductive material is disposed in the trench to form a second electrode. A node dielectric layer is formed between the first electrode and the second electrode.

A method for forming a trench capacitor provides a trench in a semiconductor substrate, forms a dopant rich layer in contact with the substrate in the trench and forms a spacer layer over the dopant rich layer in the trench. The substrate is exposed at a bottom of the trench. The spacer layer may optionally be removed. A first doped conductive material is formed in the trench and etched to form at least one pillar which extends from a bottom of the trench. Dopants are driven into the substrate from the dopant rich layer and the first doped conductive material to form a buried plate. The buried plate and the first doped conductive material form a first electrode. The dopant rich layer is removed and a dielectric layer is formed over the substrate in the trench and over the first doped conductive material. A second conductive material is formed in the trench over the dielectric layer to form a second electrode.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 9 is a cross-sectional view of a semiconductor device showing a single pillar formed for of a center electrode in accordance with the present invention.

DETAILED DESCRIPTION OF PREFERRED EMBODIMENTS

The present invention provides a structure and method for forming a central electrode in a deep trench. The central ground electrode provides an increase in capacitance for deep trench capacitors by providing increased surface area for a deep trench capacitor electrodes. The present invention is not limited to deep trench capacitors and may be employed in other semiconductor structures.

Figure 1:
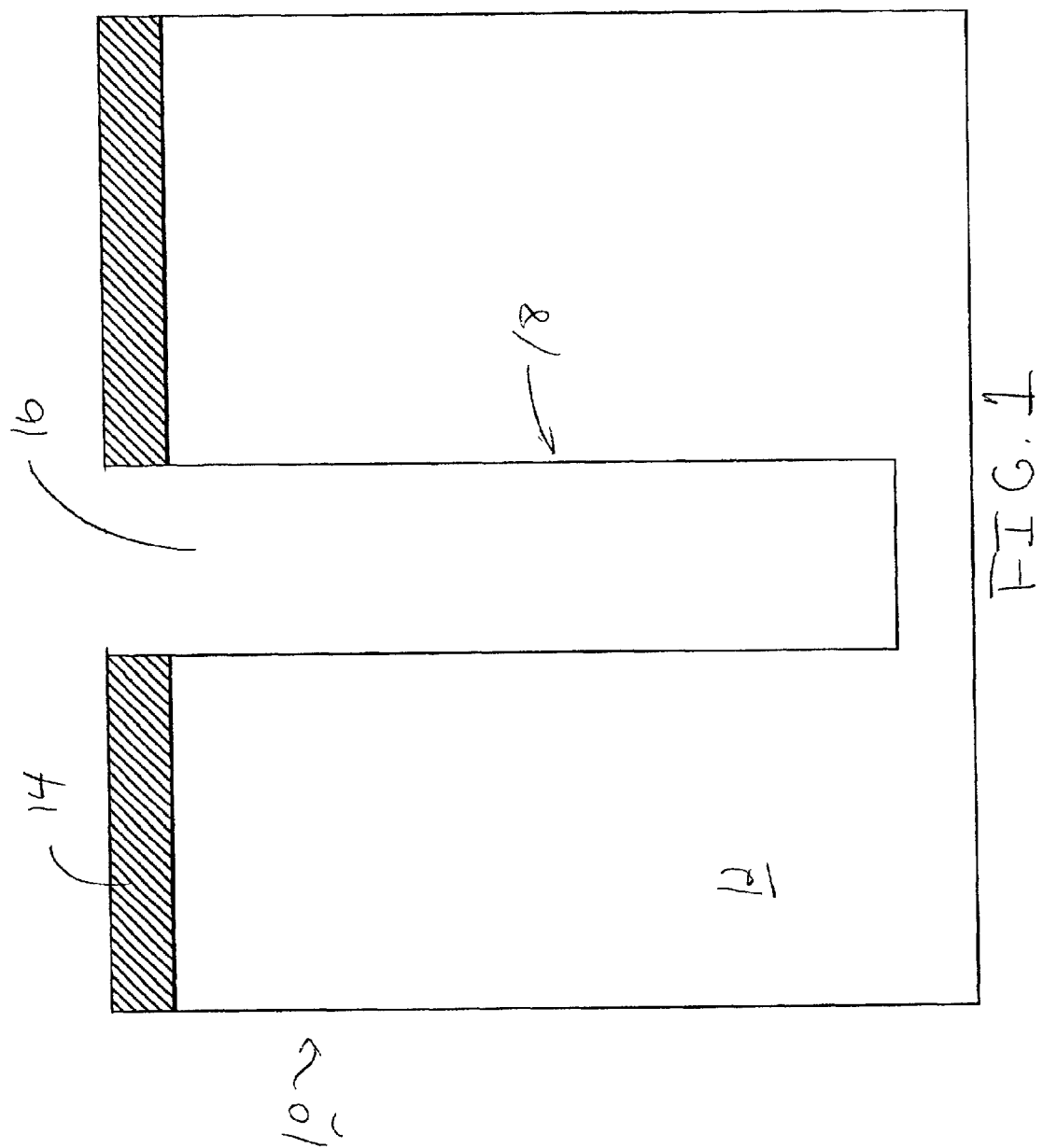
FIG. 1 is a cross-sectional view showing a semiconductor device having a trench formed in a substrate for processing in accordance with the present invention.

Referring now in specific detail to the drawings in which like reference numerals identify similar or identical elements throughout the several views, and initially to FIG. 1, a partially fabricated semiconductor device 10 is shown. Semiconductor device 10 includes a substrate 12, preferably monocrystalline silicon, although other substrate materials may be employed. Device 10 may be included as part of a semiconductor wafer and device 10 may include a dynamic random access memory (DRAM), a static random access memory (SRAM) or any other device structure, which includes trenches.

A trench mask 14 is patterned on substrate 12 by known lithography processes. Trench mask 14 may include a pad stack, and or a hard mask (e.g., a silicate glass material). Openings 16 in patterned trench mask 14 are employed to permit etching of the underlying substrate 12. Substrate 12 is etched, preferably by an anisotropic etch process (e.g., reactive ion etching) to form a trench 18 in substrate 12.

Figure 2:
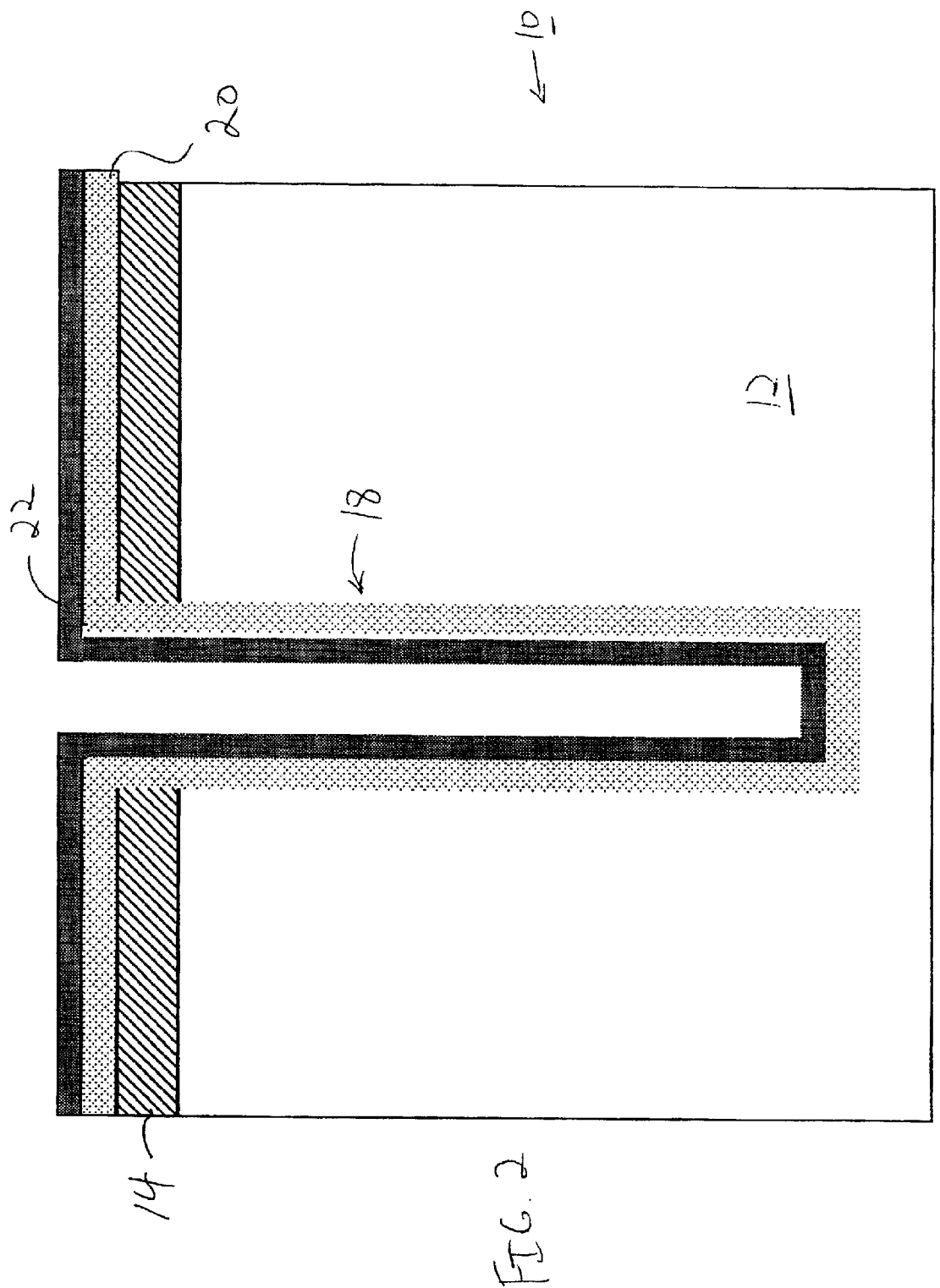
FIG. 2 is a cross-sectional view of the semiconductor device of FIG. 1 showing a dopant rich layer and a spacer layer formed in accordance with the present invention.

Referring to FIG. 2, a doped oxide layer 20 is deposited in trench 18 and over trench mask 14. This may be performed as a non-conformal fill of trench 18. In one embodiment, layer 20 includes a doped TEOS material which may include, for example, Arsenic dopants or a doped silicate glass, such as, for example, Arsenic silicate glass (ASG). Layer 20 is preferably deposited to a thickness of approximately ¼ of the thickness of the trench at a bottom dimension (e.g., the bottom dimension being, for example, a critical dimension (CD) or width of trench 18), although other thicknesses may be employed.

A sidewall-spacer layer 22 is formed over layer 20. Layer 22 may include, for example, a doped amorphous silicon layer. Dopants in layer 22 may include, for example, Arsenic. Layer 22 is deposited to a thickness sufficient to protect sidewalls of trench 18 (e.g., layer 20 on sidewalls) during an etch step which removes spacer layer 22 from a bottom of trench 18, as described herein below.

Figure 3:
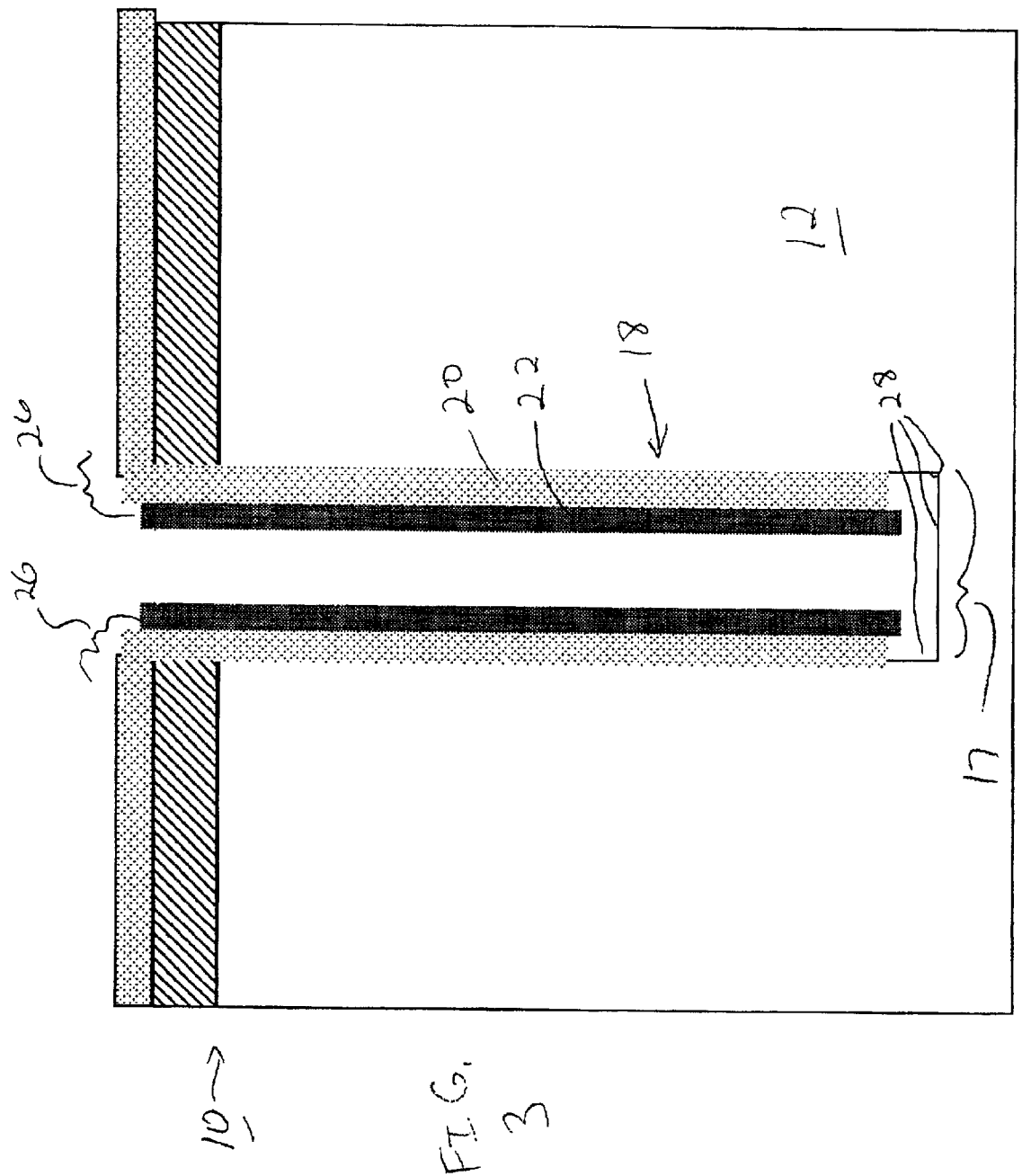
FIG. 3 is a cross-sectional view of the semiconductor device of FIG. 2 showing the substrate at a bottom portion of the trench exposed in accordance with the present invention.

Referring to FIG. 3, layer 22 is opened up at the bottom of trench 18. This is preferably provided by performing an anisotropic silicon etch. Spacer layer 22 on sidewalls of trench 18 remains and protects layer 20 on the sidewalls. Etching continues until layer 20 is exposed in at a bottom portion 17 of trench 18.

Figure 4:
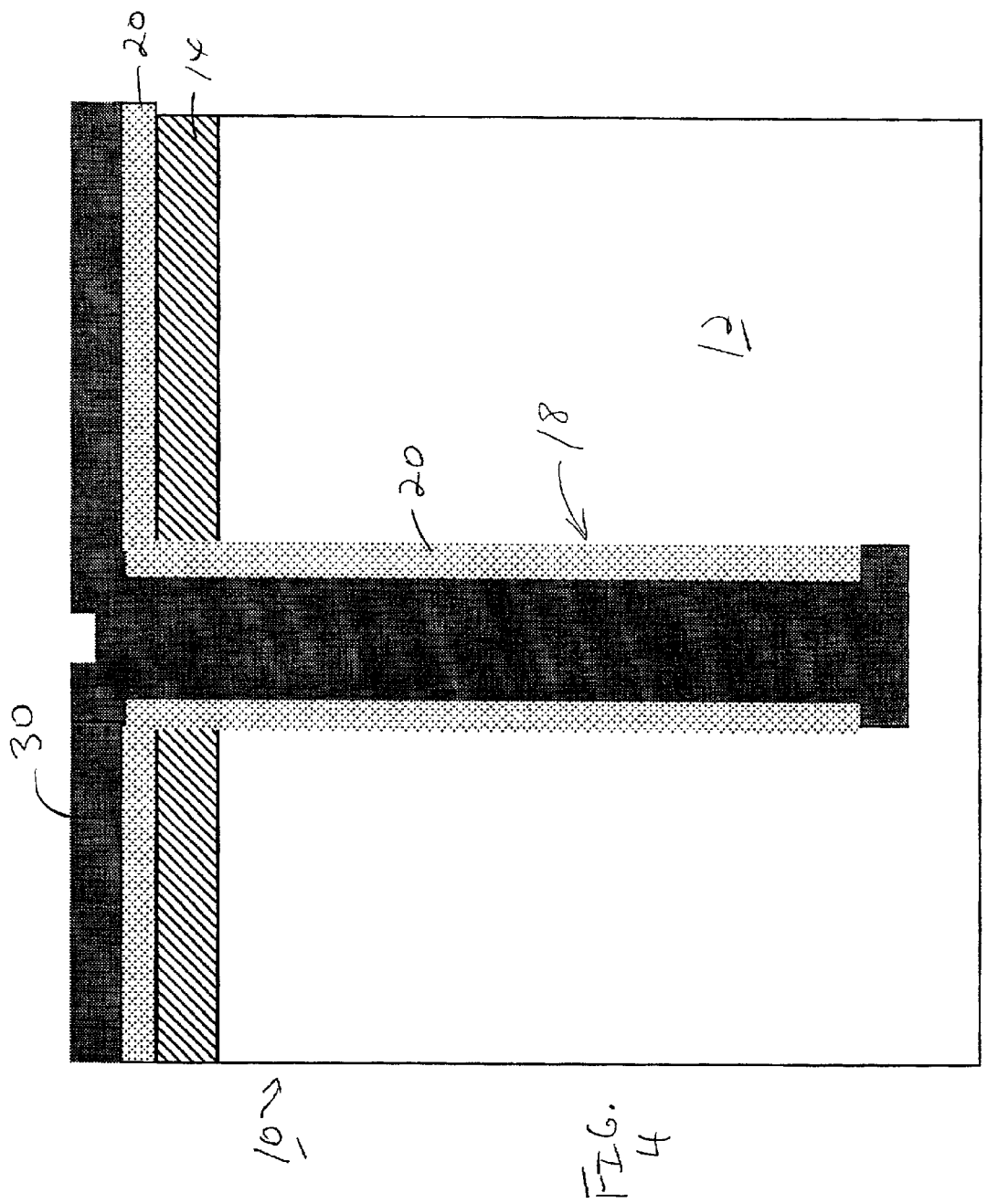
FIG. 4 is a cross-sectional view of the semiconductor device of FIG. 3 showing a conductive material formed in the trench in accordance with the present invention.

A wet etch, for example an HF or dilute HF wet etch, is employed to remove layer 22 from the bottom of trench 18. Exposed portions 26 of layer 22 are not completely removed by the wet etch. Wet etch may employ other etchants, for example, ammonium hydroxide, etc. It is preferably however, to employ an HF as a last step in the wet etch process to ensure native oxide is removed from a surface 28 of substrate 12. Layer 22 may then be removed from layer 20 on the sidewalls of trench 18 (FIG. 4). This may be performed by removing layer 22 by a wet etch selective to layer 20. Removing layer 22 is optional.

Referring to FIG. 4, a conductive material 30, for example, doped polysilicon or doped amorphous silicon, is deposited in trench 18. In one embodiment, conductive material includes Arsenic doped polysilicon or Arsenic doped amorphous silicon. Conductive material 30 is deposited to fill trench 18 and contacts the remaining portions of layer 20 (and layer 22, if present). Conductive material 30 will be employed to form a center electrode.

Figure 5:
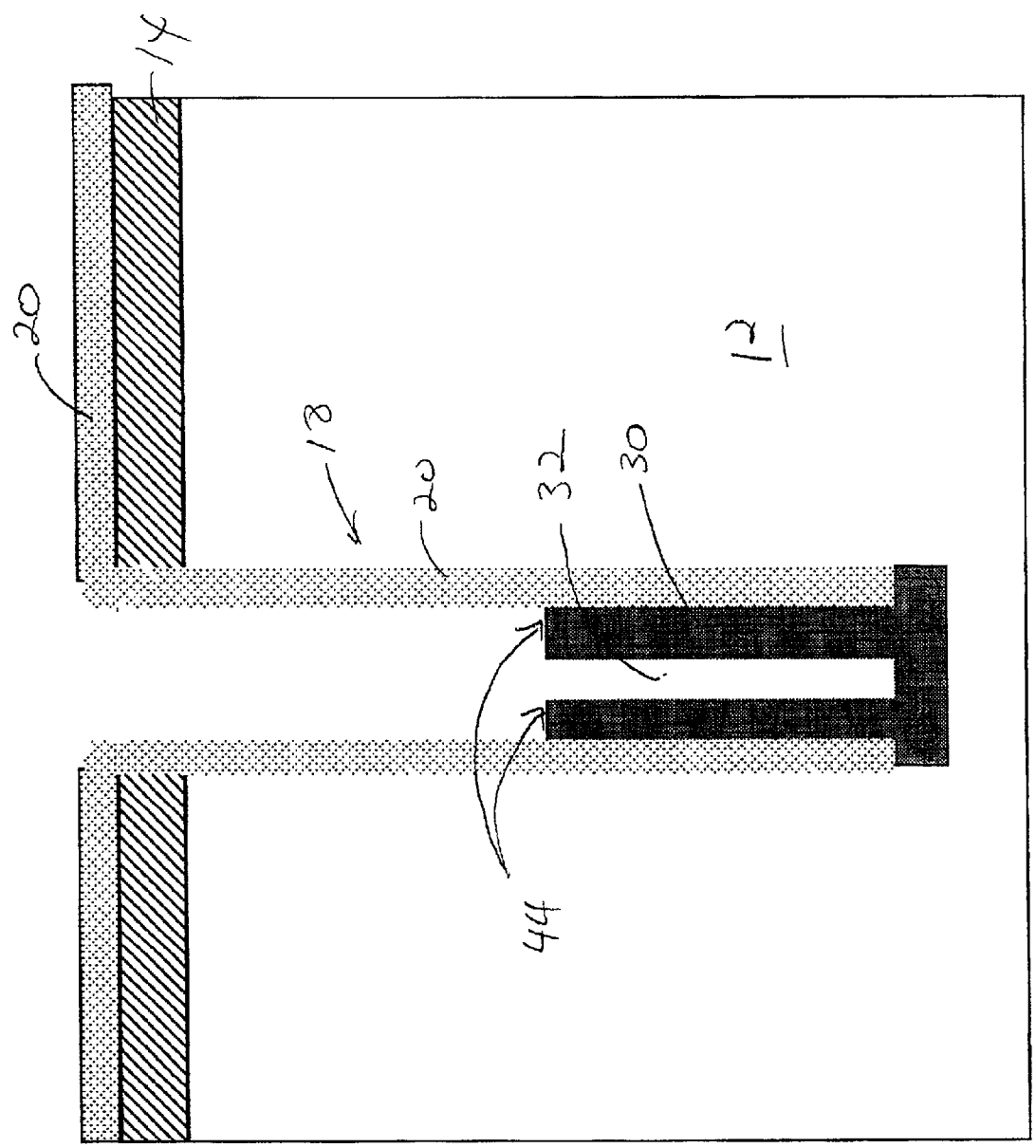
FIG. 5 is a cross-sectional view of the semiconductor device of FIG. 4 showing the conductive material etched to form a center electrode in accordance with the present invention.

Referring to FIG. 5, conductive material 30 is recessed in trench 18. Recessing may be performed by an anisotropic silicon etch. In one embodiment, trench 18 is about 6 microns deep, the etch process may etch conductive material 30 to a top-most level of about 2 microns down into trench 18 and enhance a seam or center trench 32. Center trench 32 is expanded down into trench 18 through conductive material 30. One or more pillars are formed in material 30 as a result of the trench geometry and the nature of RIE.

In alternate embodiments, the etching process may be employed with lithographic patterning or other etching techniques to pattern one or more pillars within trench 18. An etch mask may be formed on a top surface to begin seam 32, which can be extended deeper into trench by extended etching.

Figure 6:
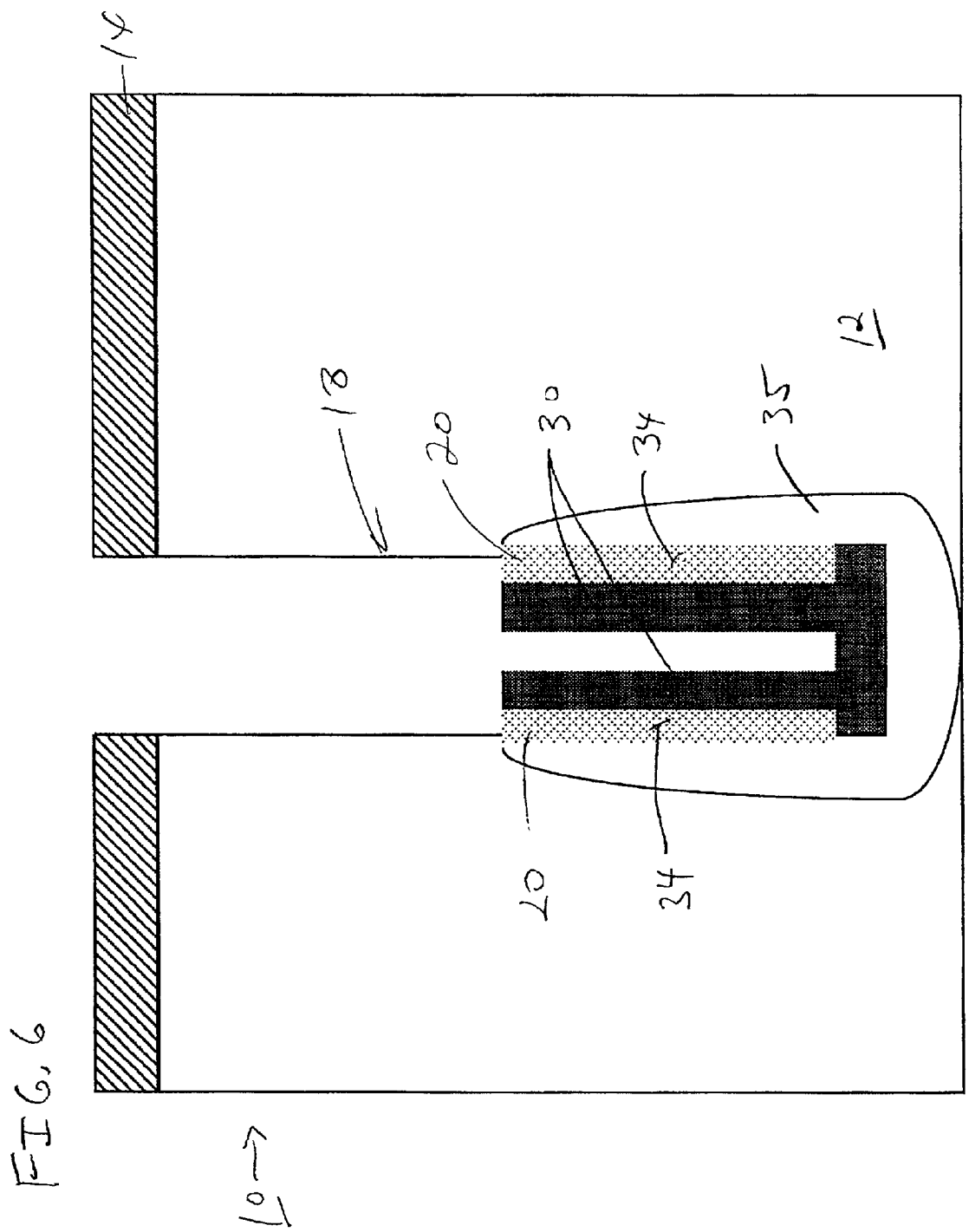
FIG. 6 is a cross-sectional view of the semiconductor device of FIG. 5 showing the formation of a buried plate in accordance with the present invention.

Referring to FIG. 6, exposed portions of layer 20 are removed by, for example, a wet etch selective to conductive material 30, for example using HF, dilute HF or buffered HF. Portions 34 of layer 20 which are covered by conductive material 30 remain in trench 18.

A high temperature anneal is performed to drive dopants from portions 34 of layer 20 into substrate 12 and into conductive material 30. In addition, dopants are driven from conductive material 30 into substrate 12. The anneal temperatures are preferably between about 600 degrees Celsius and 1200 degrees Celsius. The anneal is preferably performed in an inert environment. Flowing oxygen may be employed during temperature ramp up of the anneal to minimize autodoping of the upper part of the trench. Out-diffusion from the anneal process forms a buried plate 35 which surrounds trench 18.

Portions 34 of layer 20 are removed by, for example, a wet etch selective to conductive material 30, using for example HF.

Figure 7:
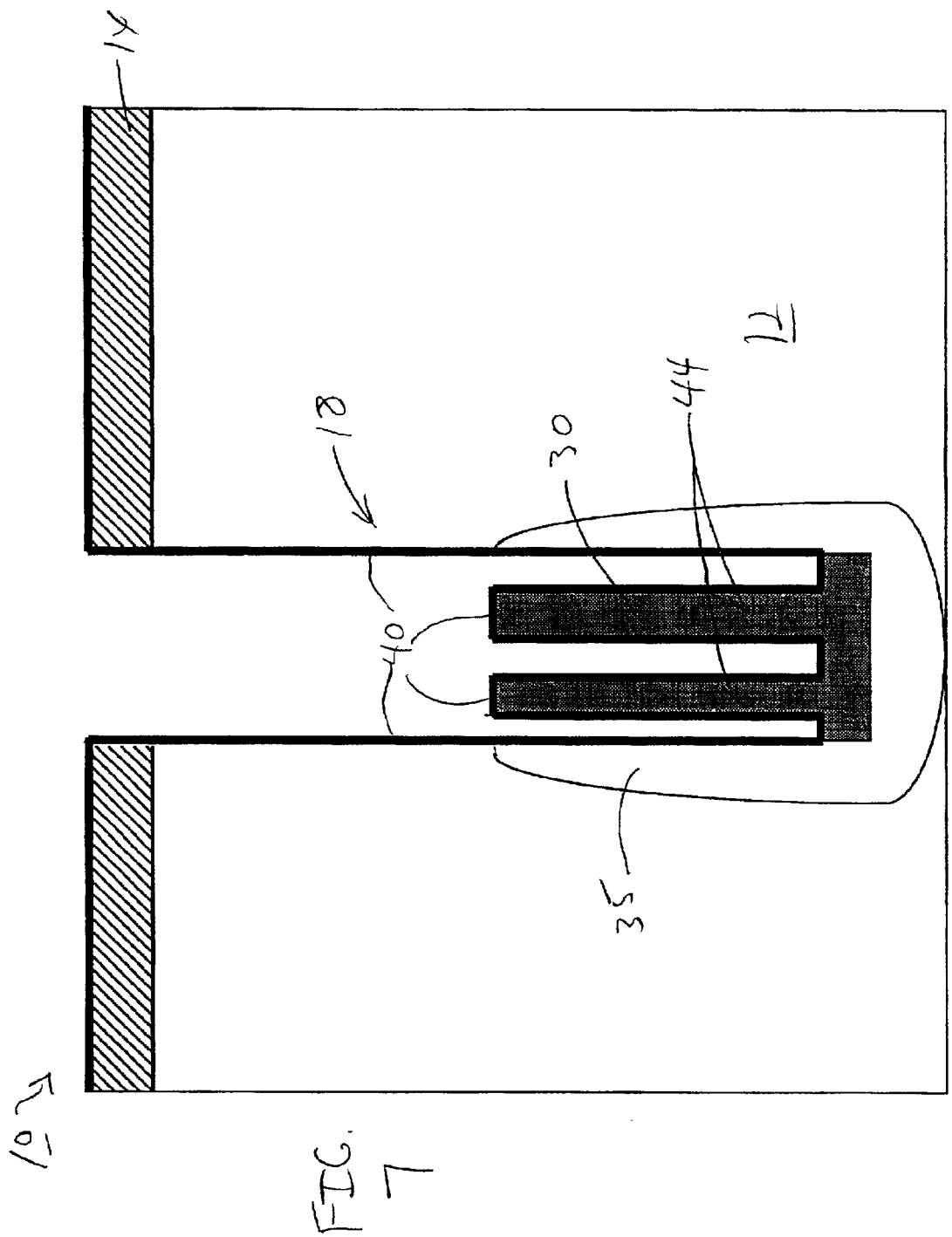
FIG. 7 is a cross-sectional view of the semiconductor device of FIG. 6 showing the formation of a node dielectric layer in accordance with the present invention.

Referring to FIG. 7, remaining portions of layer 20 are removed from the sidewalls of trench 18. A wet etch process which selectively removes layer 20 relative to conductive material 30 and substrate 12 is employed. Wet etching may include, for example, HF, dilute, HF or buffered HF etchants. Substrate 12 and conductive material 30 should be exposed in places where layer 20 existed.

A node dielectric layer 40 is deposited over all surfaces to cover exposed sidewalls of substrate 12 and exposed surfaces of conductive material 30. Conductive material 30 forms a center electrode 44. Node dielectric layer 40 preferably includes a nitride material, such as silicon nitride or silicon oxy-nitride. In one embodiment, an oxidation may be performed to oxidize a silicon nitride node dielectric layer to from silicon oxy-nitride.

Node dielectric layer 40 forms a capacitor dielectric layer. Node dielectric layer 40 may be from about 1 nm to about 7 nm in thickness. Other thicknesses may be employed depending of the specific needs of a given design.

Figure 8:
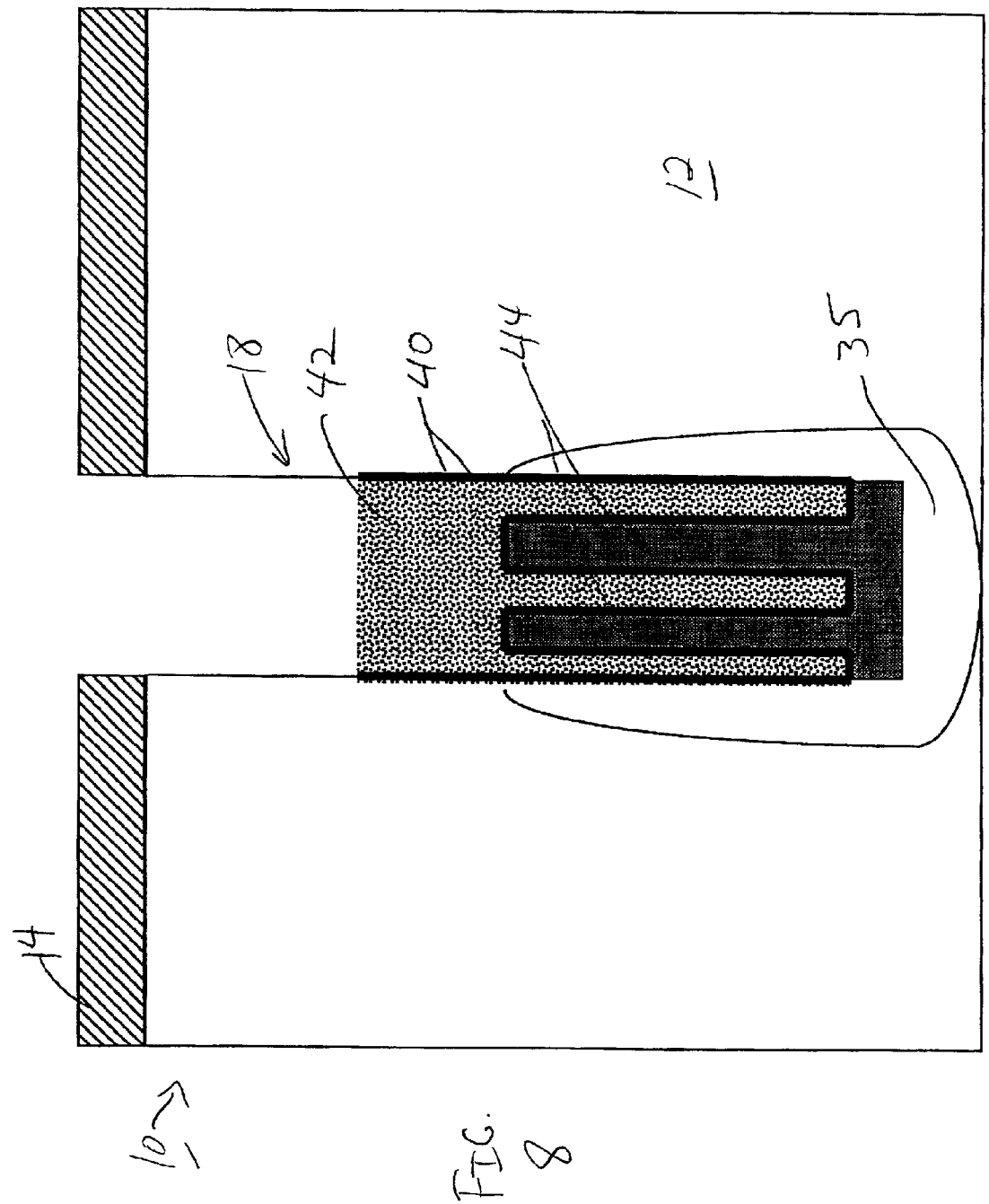
FIG. 8 is a cross-sectional view of the semiconductor device of FIG. 7 showing the formation of a second conductive material to form a second electrode in accordance with the present invention.

Referring to FIG. 8, trench 18 is filled with a conductive material 42. Conductive material 42 may include a doped amorphous silicon, preferably an Arsenic-doped amorphous silicon, to fill trench 18. Conductive material 42 is preferably deposited by a chemical vapor deposition (CVD) process or a plasma enhanced CVD process. In this way, conductive material 42 fills in any gaps or spaces between portions of electrode 44 and between electrode 44 and substrate 12.

An anisotropic etch process is performed to recess conductive material 42 in trench 18. Node dielectric layer 40 which is exposed by the recessing of conductive material 42 is removed by using a wet etch process. Processing continues on device 10 as is known in the art. For example, a trench collar deposition and formation process are followed by shallow trench isolation, gate formation, access transistor dopant implantation and device formation, contact and metallization formation, etc.

Center electrode 44 and buried plate 35 form a first electrode of a deep trench capacitor. A second electrode of the deep trench capacitor is formed by conductive material 42. By the present invention, surface area shared between the first and second electrodes is significantly increased, for example, an increase in surface area of between about 10% and about 150% may be achieved. Greater surface areas are contemplated and may depend on the design of the device.

It is to be understood that the present invention may include a plurality of different formations for center electrode 44. For example, center electrode may include a single pillar extending from a bottom portion of the trench, or include a plurality of pillars extending from a bottom portion of the trench. As illustratively shown in FIG. 9, a single pillar 48 is depicted for electrode 44. A collar deposition layer 50 is also shown for forming a collar in later processing steps. Based on the foregoing one skilled in the art may envision other variation and embodiments of the present invention.

Having described preferred embodiments for increase in deep trench capacitance by a central ground electrode (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor device, comprising:
   a trench formed in a substrate;
   a diffusion region surrounding the trench to form a buried plate;
   a first conductive material formed in the trench, wherein the first conductive material comprises at least one pillar extending from a bottom of the trench, wherein the first conductive material contacts the buried plate along an entire bottom portion of the trench and along a lower portion of the sidewalls of the trench, and wherein the first conductive material and the buried plate form a first electrode;
   a second conductive material disposed in the trench to form a second electrode; and
   a node dielectric layer formed between the first electrode and the second electrode.

2. The semiconductor device as recited in claim 1, wherein the first conductive material comprises a plurality of pillars extending from the bottom of the trench.

3. The semiconductor device as recited in claim 2, wherein a portion of the second conductive material is disposed between the plurality of pillars.

4. The semiconductor device as recited in claim 1, wherein the first conductive material includes one of a doped polysilicon and a doped amorphous silicon.

5. The semiconductor device as recited in claim 1, wherein the second conductive material includes doped amorphous silicon.

6. The semiconductor device as recited in claim 1, wherein a portion of the second conductive material is disposed between the first conductive material and the buried plate.

7. A semiconductor device, comprising:
   a trench formed in a substrate;
   a diffusion region surrounding the trench to form a buried plate;
   a first conductive material formed in the trench, wherein the first conductive material comprises a plurality of pillars extending from a bottom of the trench, wherein the first conductive material contacts the buried plate along an entire bottom portion of the trench and along a lower portion of the sidewalls of the trench, and wherein the first conductive material and the buried plate form a first electrode;
   a second conductive material disposed in the trench to form a second electrode; and
   a node dielectric layer formed between the first electrode and the second electrode.

8. The semiconductor device as recited in claim 7, wherein the first conductive material is formed into the plurality of pillars extending from the bottom of the trench.

9. The semiconductor device as recited in claim 8, wherein the plurality of pillars includes the second conductive material disposed between the plurality of pillars.

10. The semiconductor device as recited in claim 7, wherein the first conductive material includes one of a doped polysilicon and a doped amorphous silicon.

11. The semiconductor device as recited in claim 7, wherein the second conductive material includes doped amorphous silicon.

12. The semiconductor device as recited in claim 7, wherein the second conductive material is disposed between the first conductive material and the buried plate.

* * * * *